(12) United States Patent
Grasso

(10) Patent No.: US 11,018,640 B2
(45) Date of Patent: May 25, 2021

(54) DIFFERENTIAL AMPLIFIER, CORRESPONDING INTEGRATED CIRCUIT, SYSTEM, INSTRUMENTATION AMPLIFIER AND METHOD

(71) Applicant: STMicroelectronics S.r.l., Agrate Brianza (IT)

(72) Inventor: Daniele Grasso, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 19 days.

(21) Appl. No.: 16/410,383

(22) Filed: May 13, 2019

(65) Prior Publication Data

US 2019/0363686 A1 Nov. 28, 2019

(30) Foreign Application Priority Data

May 28, 2018 (IT) .......................... 102018000005777

(51) Int. Cl.
*H03F 3/45* (2006.01)
*H03F 1/02* (2006.01)

(52) U.S. Cl.
CPC ....... *H03F 3/45188* (2013.01); *H03F 1/0211* (2013.01); *H03F 2200/129* (2013.01); *H03F 2200/375* (2013.01); *H03F 2200/451* (2013.01); *H03F 2203/45042* (2013.01); *H03F 2203/45116* (2013.01); *H03F 2203/45354* (2013.01); *H03F 2203/45374* (2013.01)

(58) Field of Classification Search
CPC ............... H03F 3/45188; H03F 1/0211; H03F 2200/129; H03F 2200/375; H03F 2200/451; H03F 2203/45042; H03F 2203/45116; H03F 2203/45354; H03F 2203/45374; H03F 2200/261; H03F 2203/45134; H03F 2203/45428; H03F 3/45659; H03F 3/45183; H03F 3/45475
USPC ....................................................... 330/258
See application file for complete search history.

(56) References Cited

U.S. PATENT DOCUMENTS 5,565,813 A * 10/1996 Connell ............. H03F 3/45076
327/65
6,356,152 B1 3/2002 Jezdic et al.
(Continued)

OTHER PUBLICATIONS

Kitchin, C. et al., "A Designer's Guide to Instrumentation Amplifiers 2nd Edition", Mar. 2004, 108 pages.
(Continued)

*Primary Examiner* — Khanh V Nguyen
(74) *Attorney, Agent, or Firm* — Slater Matsil, LLP

(57) ABSTRACT

A differential amplifier includes: first and second input nodes; first and second output nodes; first and second supply nodes; first and second offset compensation nodes; first and second amplifier staged configured to generate first and second output voltages at the first and second output nodes as a function of first and second input voltages of the first and second input nodes and first and second offset compensation voltages of the first and second offset compensation nodes; and a feedback circuit configured to generate the first and second offset compensation voltages as a function of the first and the second output voltages. The feedback circuit includes: a coupling circuit coupled between the first and second offset compensation nodes, wherein the coupling circuit comprises one or more passive electric components.

20 Claims, 12 Drawing Sheets

(56) References Cited

U.S. PATENT DOCUMENTS

| | | | | |
|---|---|---|---|---|
| 6,750,704 | B1* | 6/2004 | Connell | H03F 3/45753 |
| | | | | 330/253 |
| 8,248,108 | B2* | 8/2012 | Santoro | H03K 5/249 |
| | | | | 327/63 |
| 8,570,095 | B1* | 10/2013 | Ryat | H03F 3/45183 |
| | | | | 327/530 |
| 9,998,080 | B2 | 6/2018 | Trotta | |
| 2017/0170795 | A1 | 6/2017 | Garbarino et al. | |
| 2019/0068148 | A1* | 2/2019 | Oishi | H03F 3/45179 |

OTHER PUBLICATIONS

Enz, C.C. et al., "Circuit Techniques for Reducing the Effects of Op-Amp Imperfections: Autozeroing, Correlated Double Sampling, and Chopper Stabilization" Proceedings of the IEEE, vol. 84, No. 11, Nov. 1996, 31 pages.

Witte, F. et al., "Dynamic Offset Compensated CMOS Amplifiers", Jan. 2009, 31 pages.

Babanezhad, J. N., "A Low-Output-Impedance Fully Differential Op Amp with Large Output Swing and Continuous-Time Common-Mode Feedback", IEEE Journal of Solid-State Circuits, Dec. 26, 1991, No. 12, vol. 26, No. 12, XP 000272839, pp. 1825-1833.

Wu, R. et al., Chapter 2, "Dynamic Offset Cancellation Techniques for Operational Amplifiers", Precision Instrumentation Amplifiers and Read-Out Integrated Circuits, Analog Circuits and Signal Processing, DOI: 10.1007/978-1-4614-3731-4_2, Jul. 24, 2012, 30 pages.

Pavlic, T.P., "Practical Integrators and Operational Amplifier Offset", Lab 2: The Field Effect Transistor, ECE 327: Electronic Devices and Circuits Laboratory I, Dec. 2017, 5 pages.

* cited by examiner

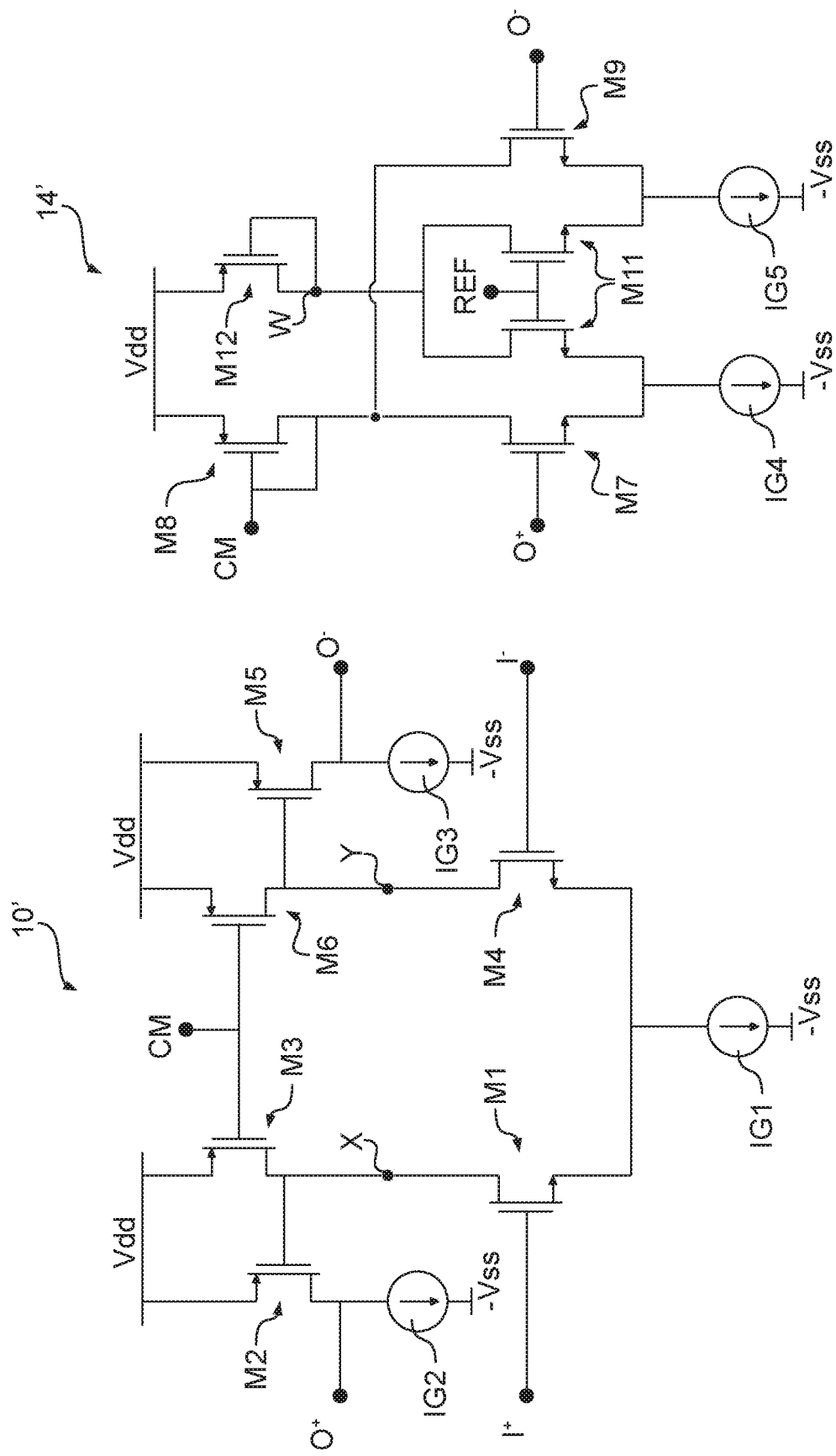

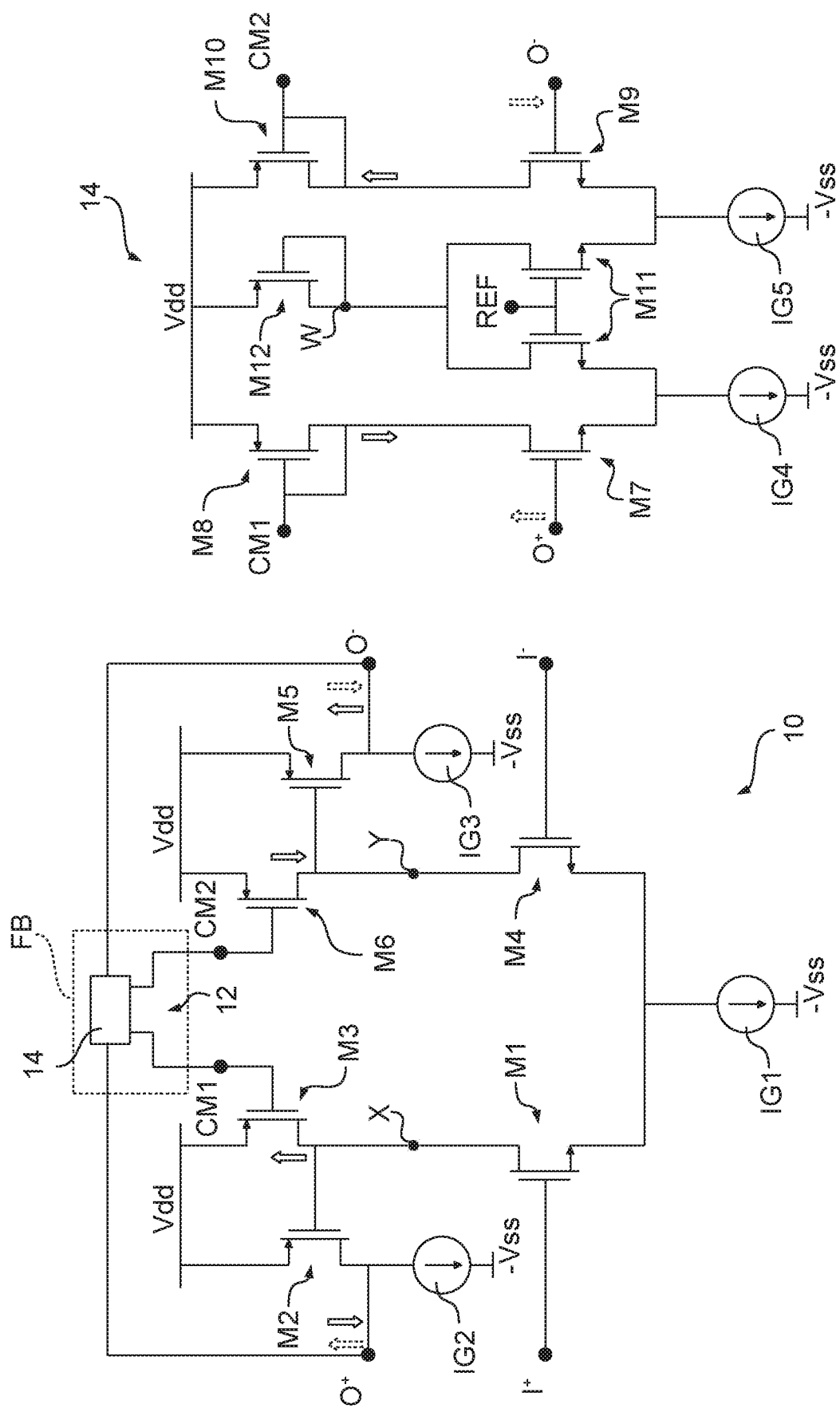

DIFFERENTIAL AMPLIFIER, CORRESPONDING INTEGRATED CIRCUIT, SYSTEM, INSTRUMENTATION AMPLIFIER AND METHOD

CROSS-REFERENCE TO RELATED APPLICATIONS

This application claims priority to Italian Patent Application No. 102018000005777, filed on May 28, 2018, which application is hereby incorporated herein by reference.

TECHNICAL FIELD

The description relates generally to electronic circuits, and, in particular embodiments, to differential amplifiers, corresponding integrated circuit, system, instrumentation amplifier and method.

BACKGROUND

Differential amplifiers are well-known in the art, and may be used e.g., in sensor circuits, comparators, integrators, etc.

Generally, differential amplifiers have first and second input nodes that receive a differential input signal, and first and second output nodes that transmit a differential output signal, comprising the differential input signal amplified. The differential output signal is transmitted by a third output node, the differential output signal being a difference between the signal transmitted by the first output node and the signal transmitted by the second output node.

Conventionally, a DC offset at the output nodes may occur. That is, a non-null output signal OUT occurring at the output nodes even if no input signal IN is applied to the input nodes. For example, the DC offset may be due to an internal offset, caused by dissymmetry and mismatch of internal components of the differential amplifier. Specifically, such DC offset (which may be represented by a small continuous $\Delta V$ placed at the input nodes of the amplifier even in the absence of the input signal) may result in an amplified output voltage $G*\Delta V$ at the output nodes, where G is a DC open loop gain of the amplifier.

Considering that the open loop gain G may have a relatively high value, the DC offset at the output nodes may result in a non-negligible, constant unbalance, that may affect a dynamic range performance of the amplifier. For example, the output signal OUT may be constantly saturated, thus hindering the amplifier performance.

Different solutions have been developed for the instant technical problem. For example, the differential amplifier may be arranged in a closed loop feedback, with external components that connect the first and second output node to the second and first input node, respectively, with various configurations, that operate in DC. However, in such closed loop configurations, the gain G, an input impedance, and an output impedance, may be modified, and may depend on values of the external components. In particular, the input impedance may be non-negligibly lowered, which may be detrimental if a high input resistance is desired such as in case of instrumentation applications.

For example, in an analog integrator comprising a differential amplifier, where each external component comprises a capacitor, the integrator DC closed loop of the differential amplifier corresponds to the open loop of a differential amplifier having no external components. However, this entails that a DC offset may be present, affecting the integrator performance in terms of linearity and dynamic range as well as affecting the integrator output, which may remain set at the supply voltage.

Another example may comprise employing a Miller integrator configuration, where each external component comprises a high value resistance in parallel with a capacitance. In this case, the amplifier gain may be reduced overall. Considering that the DC gain is reduced, the DC offset at the output nodes is also reduced. However, this solution depends on values of the resistances employed. If these values are lower than a certain threshold, the Miller integrator may start operating as a low pass filter. A trade off may thus exist, depending on the requirements of the amplifier, and the resistances employed may be chosen in the range of mega ohms.

Static offset cancellation techniques may be employed, which are conventionally performed during production. An example is trimming, which comprises calculating a DC offset of the differential amplifier when no input voltage is present at the input nodes and providing two further external nodes in the differential amplifier that are adapted to receive a differential voltage that minimizes the DC offset of the amplifier. However, trimming is performed once at the beginning of the amplifier life, and it does not compensate a DC offset drift due to temperature and time. Also, trimming may introduce an additional cost for testing.

Furthermore, dynamic offset cancellation techniques may be employed, which may have an improved long term stability, no additional costs for testing and a reduction of 1/f noise with respect to the static techniques previously discussed. However these techniques result in an increased circuit complexity for the differential amplifier.

An example of dynamic offset cancellation is auto-zeroing, which is a discrete-time technique not suitable for continuous-time applications. Auto-zeroing comprises two phases: an auto-zero (sampling) phase, at a first clock phase, where the offset is sampled, and a signal phase, at a second clock phase, where the DC offset is subtracted from the amplified input signal.

Specifically, an output storage auto-zeroing technique may be used, where a capacitor is arranged at the output node of the amplifier, thereby:

at a first clock phase, the amplifier is disconnected from the signal path (thanks to switches) and the amplified offset is stored in the capacitor, and at a second clock phase, the signal is amplified by the amplifier and the offset stored in the capacitor during the previous phase is subtracted from the signal.

Ideally, the offset is compensated. However a charge injection due to the switches as well as a leakage of the capacitor during the signal phase may be present, which may cause a residual offset. The residual offset may be divided by the amplifier gain since the offset is referred at the input of the amplifier. On the other hand, an amplifier output range is reduced as a function of the compensated offset.

Also, an input storage (or closed loop) auto-zeroing technique may be adopted, where the capacitor is arranged at the input of the amplifier so that the amplifier output range is not decreased. On the other hand, in this case the residual offset due to leakage and injected charge is not divided by the gain. In both the output storage and input storage case, the residual offset may be reduced by increasing the size of the capacitor and by adopting differential circuits. Furthermore, auto-zeroing techniques may facilitate reducing a time invariant, low frequency noise such as the 1/f noise.

Another dynamic compensation technique includes chopping, which is a continuous-time frequency modulation technique able to filter the offset at the output of the amplifier. In a chopper amplifier, the input signal is frequency modulated so that the input signal and the offset signal are shifted to different frequencies. To achieve the modulation, a first frequency modulator is arranged at the input of the amplifier, which operates on the input signal by shifting the input signal to higher frequencies, and a second frequency modulator is arranged at the output of the amplifier, that operates on the output signal as well as the offset signal, by demodulating the input signal and shifting the offset signal to higher frequencies. A low pass filter may be also employed downstream of the second frequency modulator, filtering the offset signal having higher frequency. The frequency modulators may comprise a polarity switch, called chopper, driven by a square wave.

Thanks to the chopper arrangement, various low frequency issues are reduced. For example, for reducing the 1/f noise, a chopper modulation frequency higher than 1/f noise corner frequency is desired. However the residual offset, due to the charge injection from the chopper switches, increases depending on component mismatches and the chopper modulation frequency. Also, considering that these types of amplifiers use filtering to reduce aliasing and intermodulation issues, chopper amplifiers may be unsuitable for wideband applications.

A further example of dynamic offset cancellation technique is a ping-pong technique, which uses two time-discrete auto-zero circuits, placed in parallel, which may produce a wide band continuous amplified output. Specifically, when a first auto-zeroing circuit is in the first phase, a second auto-zeroing circuit is in the second phase and amplifies the signal, and vice versa.

This technique may exhibit the same advantages of the previously discussed techniques, i.e., time continuous output and possibility of managing wide band signals (due to the absence of a low pass filter).

SUMMARY

One or more embodiments relate to techniques for reducing DC offset at an output of a differential amplifier.

One or more embodiments may include a corresponding integrated circuit IC including the differential amplifier, a corresponding system (e.g., a radar system), a corresponding instrumentation amplifier as well as a method for reducing a DC offset in the differential amplifier according to one or more embodiments.

BRIEF DESCRIPTION OF THE DRAWINGS

One or more embodiments will now be described, by way of example only, with reference to the annexed figures, where:

FIGS. 1 and 2 represent a differential amplifier including an output common mode feedback and a common mode feedback circuit, FIGS. 3 to 14 exemplify features of differential amplifiers according to one or more embodiments, FIG. 15 exemplifies gain behaviors over frequency of differential amplifiers according to one or more embodiments, FIG. 16 exemplifies features of a differential amplifier according to one or more embodiments.

DETAILED DESCRIPTION OF ILLUSTRATIVE EMBODIMENTS

Figure 4:
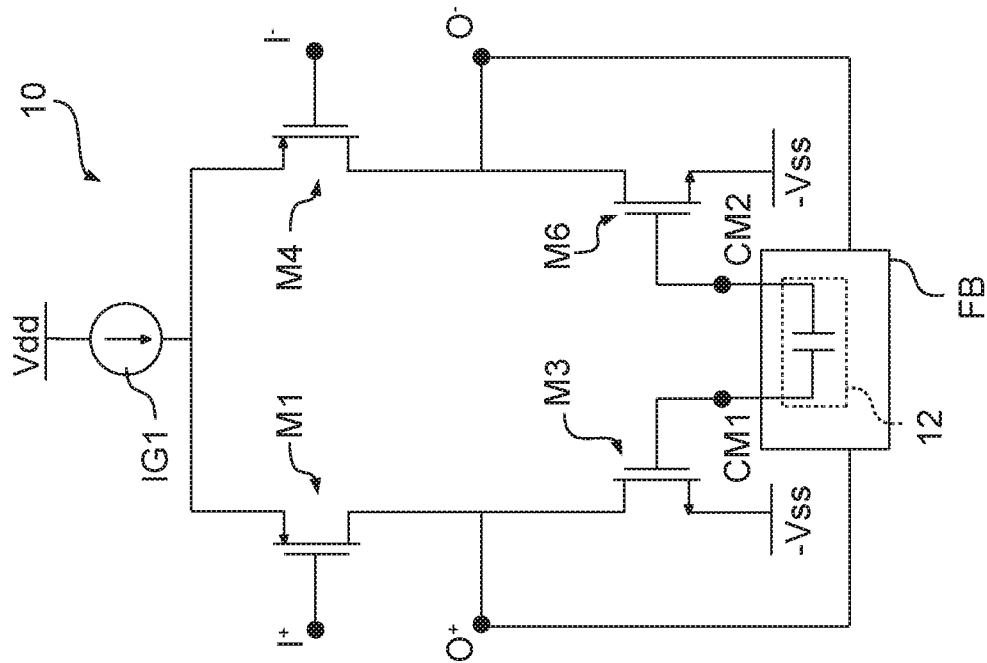

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

FIG. 1 is exemplary of a two-stage differential amplifier 10'.

Generally, the differential amplifier 10' comprises a first input node $I^+$ and a second input node $I^-$, configured to receive a first input voltage $VI^+$ and a second input voltage $VI^-$, the input voltages $VI^+$, $VI^-$ forming a differential input signal IN to the differential amplifier 10', i.e.:

$$VIN=VI^+-VI^-$$

The differential amplifier 10' comprises also a first output node $O^+$ and a second output node $O^-$, configured to provide a first output voltage $VO^+$ and a second output voltage $VO^-$, the output voltages $VO^+$, $VO^-$ forming a differential output signal OUT of the differential amplifier 10' provided at a third output voltage node (not visible in the figure), i.e.:

$$VOUT=VO^+-VO^-$$

Moreover, the differential amplifier 10' comprises a positive supply node and a negative supply node, configured for receiving a first, positive supply voltage +Vdd, e.g., 2.5 V, and a second supply voltage Vss, e.g., 0V. In some embodiments the second supply voltage Vss may be negative (i.e., having a voltage lower than 0 V).

In the embodiment considered, the differential amplifier 10' comprises also common mode node CM for receiving a common mode voltage $V_{CM}$. Specifically, as will be described in the following, the common mode voltage $V_{CM}$ may be provided to the differential amplifier 10' in order to set an output bias point. Specifically, the differential amplifier 10' may comprise a Common Mode Feedback CMF circuit 14', exemplified in FIG. 2, configured for receiving the first output voltage $VO^+$ and the second output voltage $VO^-$ and for generating the output common mode voltage $V_{CM}$ supplied at the common mode node CM as a function of the output signal as will be described in the following.

With reference to a first branch of the two-stage differential amplifier 10' of FIG. 1, a first MOSFET M1 and a second MOSFET M2 are present, having a gate, a source and a drain, where:

the first (n-channel) MOSFET M1 has a gate connected to the first input node I⁺, source connected to a first current generator IG1 and a drain connected to a first intermediate node X, and the second (p-channel) MOSFET M2 has a gate connected to the first intermediate node X, a source connected to the positive power supply node and a drain connected to the first output node O⁺ as well as to a second current generator IG2, thereby implementing a variable current generator, where the bias current generators IG1, IG2, connected also to the second supply voltage Vss, are configured to contribute achieving a bias voltage for the circuit.

During operation, the first input voltage VI⁺ at the gate of the first MOSFET M1 is amplified and inverted by the first MOSFET M1, and a resulting first intermediate voltage, at the gate of the second MOSFET M2, is amplified and inverted by the second MOSFET M2. A resulting voltage, comprising the first output voltage VO⁺, is fed to the first output node O⁺.

Also, in the differential amplifier 10', a third (p-channel) MOSFET M3 is present. The third (p-channel) MOSFET M3 has a gate connected to the common mode node CM, a source connected to the positive power supply node, and a drain connected to the first intermediate node X. During operation, the third MOSFET M3 receives the output common mode voltage $V_{CM}$ and provides, at the first intermediate node X, an inverted and amplified replica thereof. A feedback is thus present that biases the output voltage at the output common node voltage $V_{CM}$, insofar as the first intermediate voltage is adapted, before being amplified, as a function of the common mode voltage $V_{CM}$.

A second branch of the differential amplifier 10' may include mirror components with respect to the first branch described above. In the present example, the second branch comprises:

a fourth (n-channel) MOSFET M4 having a gate connected to the second input node I⁻, a source connected to the first current generator IG1, and a drain connected to a second intermediate node Y, a fifth (p-channel) MOSFET M5 having a gate connected to the second intermediate node Y, a source connected to the positive power supply node, and a drain connected to the second output node O⁻ as well as to a third current generator IG3, that may correspond to the second current generator IG2, and a sixth (p-channel) MOSFET M6 having a gate connected to the common mode node CM, a source connected to the positive power supply node and a drain connected to the second intermediate node Y.

The fourth M4, fifth M5 and sixth M6 MOSFETs of the second branch are configured for receiving the second input voltage VI⁻ from the second input node I⁻ and providing at the second output node O⁻ the resulting second output voltage VO⁻ in a manner non-dissimilar from what described above with respect to the first branch.

FIG. 2 exemplifies a possible circuital implementation for a Common Mode Feedback CMF circuit 14', comprising:

a seventh (n-channel) MOSFET M7, having a gate connected to the first output node O⁺, a source connected to a fourth current generator IG4 and a drain connected to the common mode node CM, an eight (p-channel) MOSFET M8, having a gate and a drain connected to the common mode node CM and a source connected to the positive supply node, and a ninth (n-channel) MOSFET M9, having a gate connected to the second output node O⁻, a source connected to a fifth current generator IG5 and a drain connected to the common mode node CM.

Also, the common mode feedback circuit 14' may comprise a voltage reference branch, comprising:

first and a second (n-channel) reference MOSFETs M11, having respective gates connected to the reference voltage node REF, respective sources connected to the fourth and fifth current generator IG4, IG5, respectively, and respective drains connected to a third intermediate node W, and a third (p-channel) reference MOSFET M12, having gate and drain connected to the third intermediate node W and its source connected to the positive power supply node.

During operation, the first output voltage VO⁺ and the second output voltage VO⁻ are amplified and inverted at the seventh and ninth MOSFETs M7, M9, respectively. Also, the currents at the drains of the seventh and ninth MOSFETs M7, M9, indicative of the output voltages VO⁺ and VO⁻ are summed, thereby generating the output common mode voltage $V_{CM}$ supplied at the common mode node CM, the common mode voltage $V_{CM}$.

One or more embodiments provide improved solutions for reducing the DC offset of a differential amplifier, the DC offset being present even in the absence of an input signal at the input nodes of the differential amplifier. In particular, an internal solution to the aforementioned problem is desired, e.g., an internal DC offset feedback circuit. In the differential amplifier 10' of FIG. 1, the output common mode voltage feedback maintains the common component of the first and second output voltages, while cancelling out the differential component including the DC offset. Accordingly, in the circuit 10' of FIG. 1, no internal solution may be implemented for the differential DC offset, especially if the differential amplifier 10' is used in an open loop configuration.

One or more embodiments may thus relate to an offset feedback differential amplifier OFA, that may comprise a DC offset negative feedback circuits, configured to receive a first and a second output voltage of the differential amplifier and provide as an output a first signal and a second signal, indicative of the DC offset at the output nodes of the amplifier, as detailed in the following. In particular, the DC offset feedback circuit according to embodiments of the invention may be independent of a first and second input node. Components for compensating the DC offset, external to the differential amplifier, may thus be avoided. Accordingly, the relative (very) high impedance feature of the amplifier input nodes may be maintained even when an offset negative feedback is present.

In the following figures, parts or elements like parts or elements already discussed in connection with FIG. 1 are indicated with like references and a corresponding detailed description will not repeated for the sake of brevity. Also, for the sake of simplicity and ease of understanding, in the instant description the differential amplifiers according to one or more embodiments are exemplified as comprising n-channel or p-channel Metal Oxide Semiconductor Field Effect Transistors (MOSFETs) having a gate terminal, a source terminal and a drain terminal. However, those of skill in the art will otherwise understand that other types of components may be employed for the realization of the differential amplifiers, such as other types of Field Effect Transistors (FETs) or Bipolar Junction Transistors (BJTs).

Figure 3:
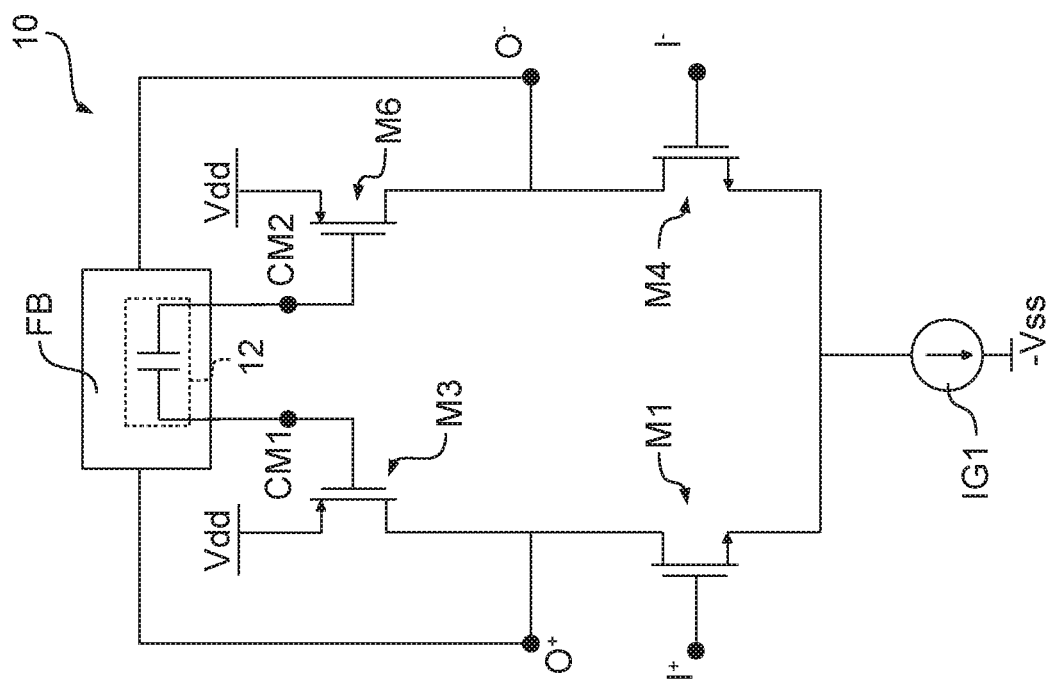

FIG. 3 represents a non-limiting example of a differential amplifier 10 according to one or more embodiments. Differential amplifier 10 of FIG. 3 may be similar to the differential amplifier 10' of FIG. 1, with however the first output voltage node O⁺ arranged at the node (in FIG. 1, the first intermediate node X) connecting the drain of the first MOSFET M1 with the drain of the third MOSFET M3; and the second output voltage node O⁻ arranged at the node (in FIG. 1, the second intermediate node Y) connecting the drain of the fourth MOSFET M4 with the drain of the sixth MOSFET M6. That is, one or more embodiments may relate to a differential amplifier 10 optionally comprising a single amplifying stage.

In the present non-limiting example, a feedback circuit FB is present, where the feedback circuit is configured for generating a first and a second feedback signal, which are applied to the gate terminals of the transistors M3 and M6, respectively. Thus, in the embodiment considered, the gate voltages of the transistors M3 and M6 may in principle be controlled independently.

Accordingly, in the embodiment considered, a DC offset that may be present at the first O⁺ and second O⁻ output nodes, respectively, may be compensated independently.

In the embodiment considered, the feedback circuit FB is thus connected (e.g., directly) to the first output voltage node O⁺ and to a first common mode node CM1, corresponding to the gate terminal of the transistor M3. Moreover, the feedback circuit FB is connected (e.g., directly) to the second output voltage node O⁻ and to a second common mode node CM2, corresponding to the gate terminal of the transistor M6.

The feedback circuit FB may control independently the voltages at the first common mode node CM1 and the second common mode node CM2. However, in various embodiments, the first common mode node CM1 and the second common mode node CM2 are indeed coupled via coupling circuit 12 comprising one or more passive electrical component, selected from capacitors, inductors and/or resistors.

Specifically, in the embodiment considered, the first common mode node CM1 and the second common mode node CM2 are connected via a capacitor 12.

Accordingly, when an AC component is generated at the output nodes O⁺ and O⁻ (e.g., due to an AC input signal applied at the first I⁺ and second I⁻ input nodes), the capacitor comprised in the passive coupling circuit 12 may behave as a short circuit. Accordingly, with respect to AC components, the AC component of the voltages at the nodes CM1 and CM2 correspond, thus representing a common mode voltage $V_{CM}$. The differential amplifier 10, under these circumstances, may behave as the differential amplifier 10' of FIG. 1. That is, the output signal OUT may be biased as a function of the output common node voltage $V_{CM}$, which may be used as a feedback.

Conversely, when a DC component is generated at the output nodes O⁺ and O⁻ (e.g., a differential DC component due to an offset of the amplifier and a common mode DC component, comprising a voltage biasing), the capacitor comprised in the passive coupling circuit 12 may behave as an open circuit. Accordingly, with respect to DC components of the voltages at the nodes CM1 and CM2 may be controlled independently. Accordingly, the first feedback signal may be used for compensating the DC offset that may be present in the first output voltage VO⁺ and the second feedback signal may be used for compensating the DC offset that may be present in the second output voltage VO⁻. The feedback circuit FB of the differential amplifier 10 may thus be used for compensating the DC offset that may be present at the output of the differential amplifier 10.

It will otherwise be appreciated that the biasing circuit represented in FIG. 3 is merely exemplary and the possibility exists of providing differential amplifiers 10 having different types of biasing configuration.

FIG. 4 represents a non-limiting example of the differential amplifier 10 complementary to the differential circuit of FIG. 3, which may exhibit different biasing circuits. For example, the differential amplifier 10 of FIG. 4 may comprise the first current source IG1 arranged between the first power supply Vdd and the node connecting the source of the first (e.g., p-channel) MOSFET M1 with the source of the fourth (e.g., p-channel) MOSFET M4. Also, the third (e.g., n-channel) MOSFET M3 and the sixth (e.g., n-channel) MOSFET M6 may be connected at the sources thereof to the second supply voltage Vss.

Figures 5, 6:
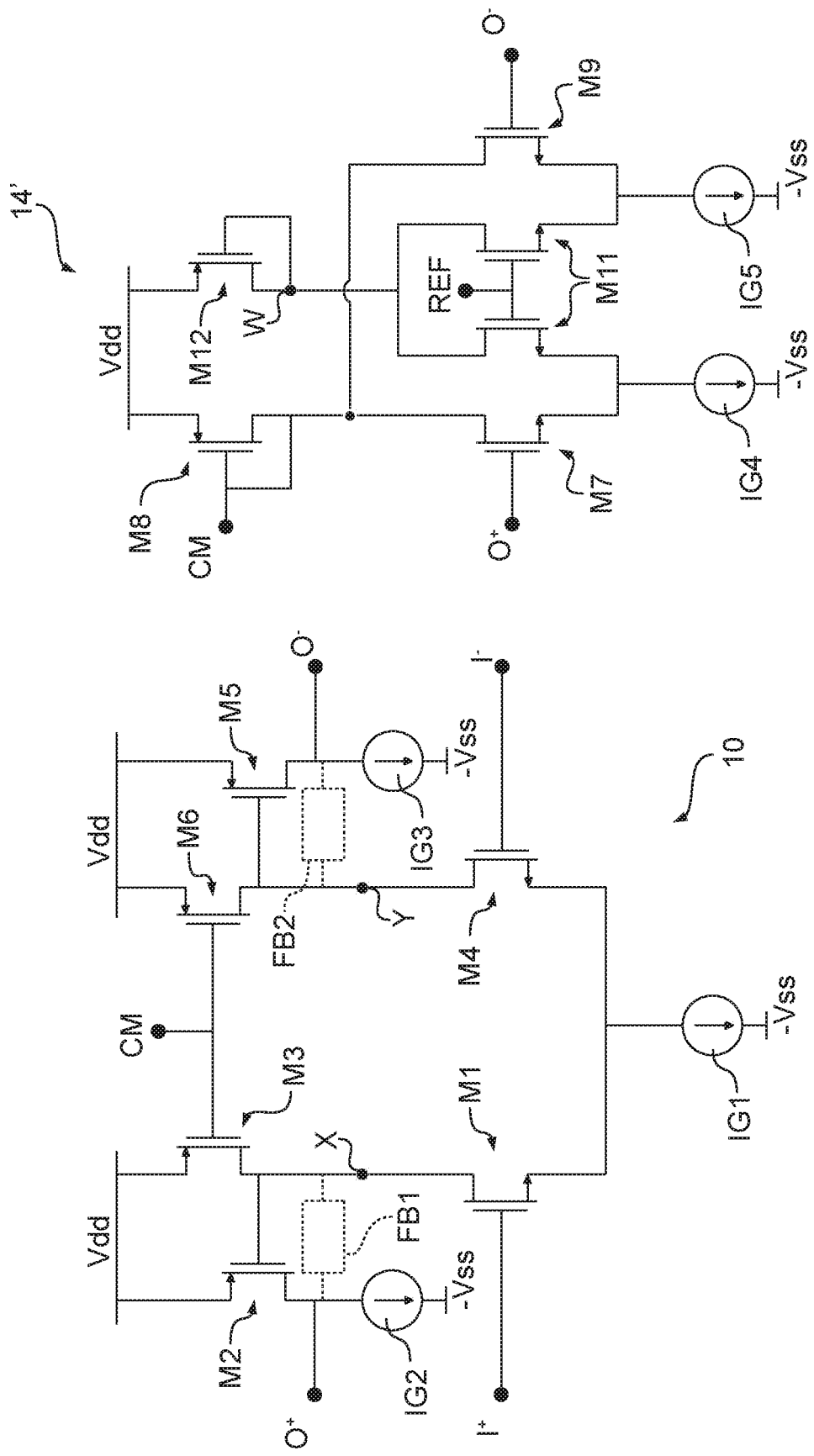

FIG. 5 represents a non-limiting example of the differential amplifier 10 according to one or more embodiments, which may comprise two amplifying stages. In particular, the first branch and the second branch of the differential amplifier 10 of FIG. 5 may correspond to the first and second branch exemplified for the differential amplifier 10' of FIG. 1. Also, the common mode node CM represented in FIG. 5 may receive a common mode voltage $V_{CM}$ from the common mode feedback circuit such as 14' represented in FIG. 6.

In the considered embodiments, a first feedback circuit FB1 may be present, connected (e.g., directly) between the first output voltage node O⁺ and the first intermediate node X, with the first feedback circuit FB1 generating a first offset compensation voltage as a function of the first output voltage VO⁺ indicative of the DC offset at the output of the differential amplifier 10. Also, a second feedback circuit FB2 may be present, connected (e.g., directly) between the second output voltage node O⁻ and the second intermediate node Y, with the second feedback circuit FB2 generating a second offset compensation voltage as a function of the second output voltage VO⁻ indicative of the DC offset at the output of the differential amplifier 10. Accordingly, for example with reference to the first branch, the second amplifying stage, i.e., the second MOSFET M2 may amplify the first input voltage VI⁺, the common mode voltage $V_{CM}$ and the first offset compensation voltage. Conversely, the fifth MOSFET M5 may amplify the second input voltage VI⁻, the common mode voltage $V_{CM}$ and the second offset compensation voltage.

Such a solution may however introduce in the differential amplifier 10 further circuital components to implement the first and second feedback circuit FB1, FB2, which may result in an increase in cost of the differential amplifier 10.

Figures 7, 8:
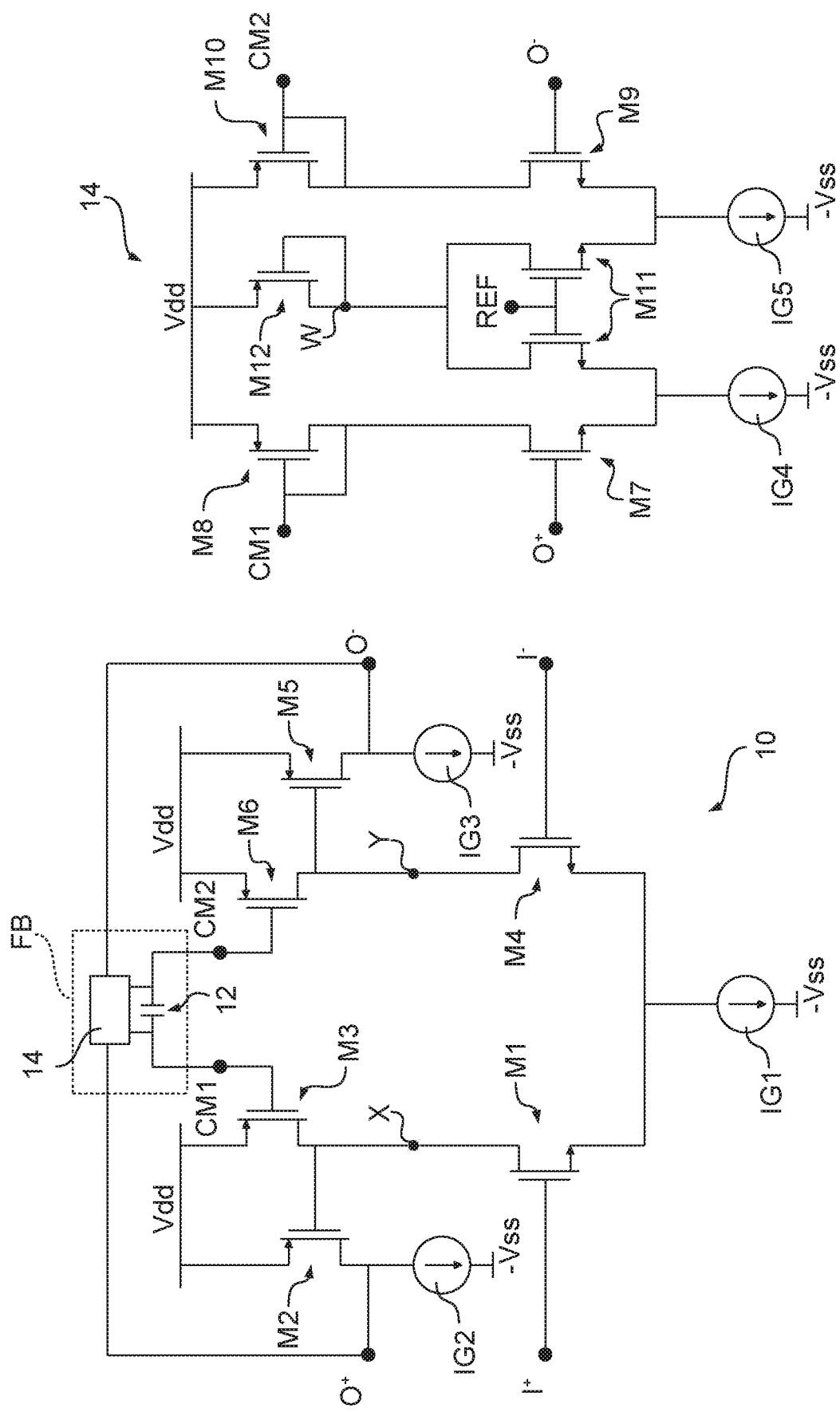

FIG. 7 represents a non-limiting example of the differential amplifier 10 according to one or more embodiments, comprising two amplifying stages. In particular, the first branch and the second branch of the differential amplifier 10 of FIG. 7 may correspond to the first and second branch exemplified for the differential amplifier 10' of FIG. 1. Again, the first CM1 and second CM2 common mode nodes may be present, arranged at the gates of the third M3 and sixth M6 MOSFETs, respectively. The first CM1 and second CM2 common mode nodes may be coupled by the passive coupling circuit 12.

In one or more embodiments, the coupling circuit 12 may comprise a capacitor. Also, the coupling circuit 12 may be external or internal with respect to the differential amplifier 10, depending on a capacitance value of the capacitor employed and, for example, for a flexibility desirable depending on the application.

For example, a capacitance value between 300 pF and 500 pF may prompt towards an integrated solution where the coupling circuit is internal to the differential amplifier 10 (e.g., implemented in the same monolithic semiconductor substrate of an integrated circuit). Conversely, a capacitance value equal to or higher than 1 pF may prompt towards a solution where the differential amplifier 10 comprises a first and a second connection pin, configured for connection to an external coupling circuit 12.

For example, in case of an integrated solution, a frequency band amplified by the differential amplifier 10 may be reduced with respect to an external solution, that may amplify AC signals at lower frequencies, as discussed in the following.

Also, in this case, an offset feedback circuit FB may be used to provide the first and second signal at the first CM1 and second CM2 common mode node, respectively, with the first and second signal being indicative of:

a common mode voltage $V_{CM}$ for AC components; and separate DC components, which include a common mode DC component, e.g., due to the voltage biasing, and a differential DC component, e.g., due to the offsets that may be present at the first $O^+$ and second $O^-$ output nodes of the differential amplifier 10.

FIG. 8 represents a non-limiting example of a possible implementation of a portion 14 of the feedback circuit FB, configured to source the first and second signal, where the feedback circuit FB may be connected to the first $O^+$ and second $O^-$ output nodes, to the first CM1 and second CM2 common mode nodes, to the first +Vdd and second Vss power supply node, and to a reference voltage node REF, where the reference voltage node REF is configured to provide to the feedback circuit FB a reference bias voltage $V_{ref}$.

The feedback circuit FB may thus comprise:

the seventh (n-channel) MOSFET M7 having a gate connected to the first output node $O^+$, a source connected to a fourth current generator IG4 and a drain connected to the first common mode node CM1, the eight (p-channel) MOSFET M8 having a gate and a drain connected to the first common mode node CM1 and a source connected to the positive supply node, the ninth (n-channel) MOSFET M9 having a gate connected to the second output node $O^-$, a source connected to a fifth current generator IG5, and a drain connected to the second common mode node CM2, and a tenth (p-channel) MOSFET M10, having a gate and drain connected to the second common mode node CM2, and a source connected to the positive supply node.

Also, the feedback circuit FB may comprise a voltage reference branch, comprising:

first and second (n-channel) reference MOSFETs M11, having gates connected to the reference voltage node REF, respective sources connected to the fourth and fifth current generator IG4, IG5, respectively, and drains connected to the third intermediate node W, and the third (p-channel) reference MOSFET M12 having a gate and a drain connected to the third intermediate node W, and a source connected to the positive power supply node.

The feedback circuit FB may thus be able to provide the common mode voltage $V_{CM}$, that may result from combining the first signal and the second signal, as well as a feedback signal indicative of the DC offset. That is, the first signal and the second signal may be indicative of the differential offset at the output nodes of the differential amplifier 10. Accordingly, the feedback circuit FB may operate as a common mode feedback circuit for AC components as well as a separate DC offset compensation circuit.

Figures 9, 10:
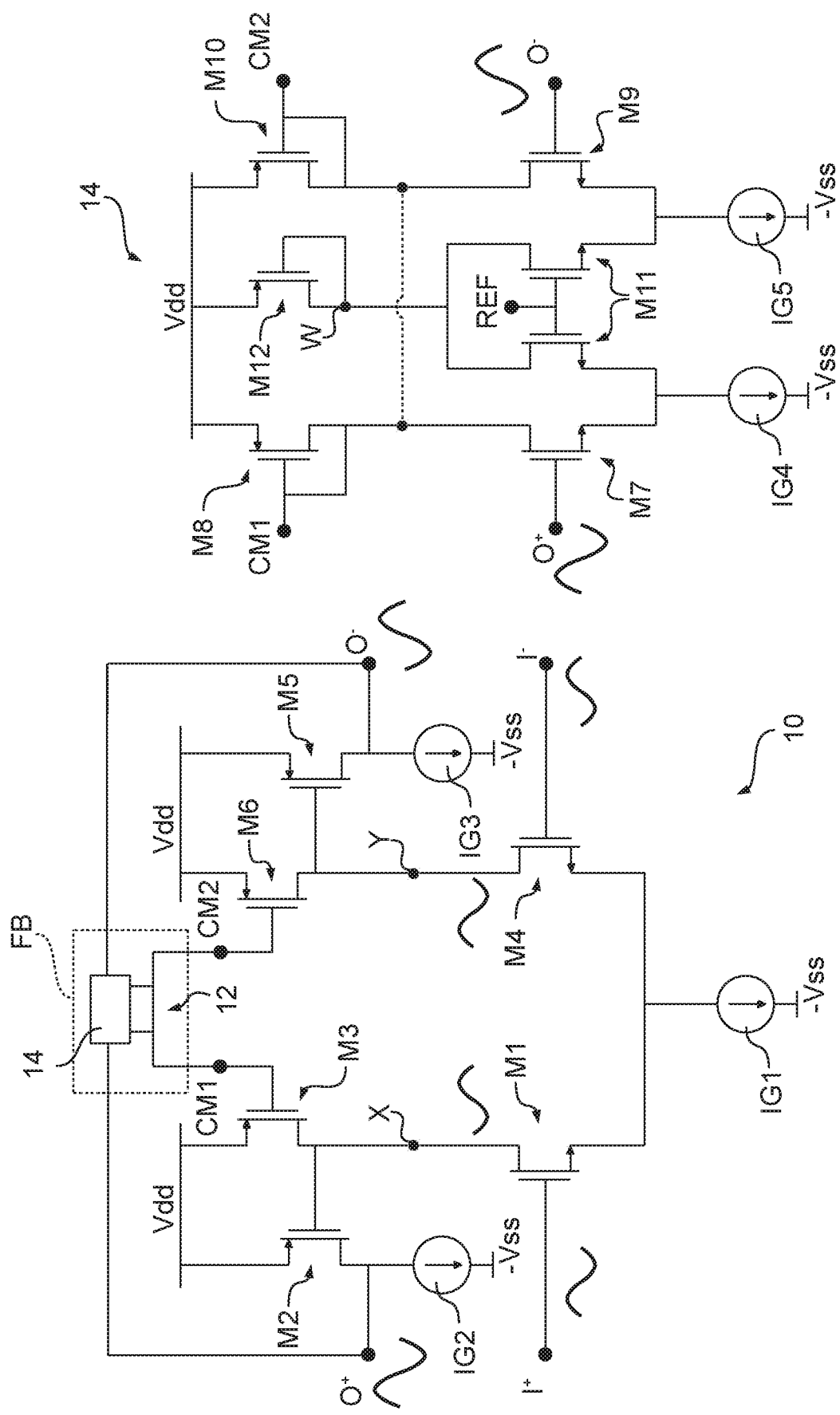

As exemplified in FIGS. 9 and 10, when the input signal IN and the output signal OUT comprise AC signals, if a frequency of the AC signal is sufficiently high, e.g., reaches a certain frequency threshold, the capacitor 12 behaves as a short circuit, the first CM1 and second CM2 common mode node are short circuited, (see e.g., the dashed line connecting the drains of transistors M7 and M9), and the first and second signal may combine and result in the common mode voltage $V_{CM}$. Accordingly, the feedback circuit 14 may behave according to the CMF circuit 14' exemplified in FIG. 2.

For example, with reference to the first branch, at the first intermediate node X, an inverted amplified replica of the AC first input voltage $VI^+$ and an inverted amplified replica of the common mode voltage $V_{CM}$ are present. The two voltages may sum (with sign) and, at the first output node $O^+$, a first amplified output voltage $VO^+$ may result, with the first output voltage $VO^+$ that may avoid saturation insofar as it is biased at the common mode voltage $V_{CM}$ by the feedback circuit FB.

In the considered AC case, a first center band gain $G0^+$ of the first branch of FIG. 9 may be written as:

$$G0^+ = gm2*gm1*(rd2\|rd0)*(rd3\|rd1)$$

where rd1, rd2, rd3 represent resistances at the drain of the MOSFETs M1, M2, M3, respectively, rd0 represents an output resistance at the first output node $O^+$ and $gm_i$ represent transconductances of respective transistors Mi.

Conversely, as exemplified in FIGS. 11 and 12, when the output signal OUT comprises a DC offset, e.g., a positive DC offset at the first output node $O^+$ and/or a negative DC offset at the second output node $O^-$ as exemplified by dashed arrows in FIG. 11, the capacitor 12 behaves as an open circuit, and the first common mode voltage $V_{CM1}$ and the second common mode voltage $V_{CM2}$ may be decoupled. As already discussed, such a DC offset at the output nodes may be due to an unwanted differential DC voltage that may be present even if no input signal IN is applied to the input nodes and may be due for example to an unbalance of internal components of the differential amplifier 10.

With reference to the first branch (the generation of the second common mode voltage $V_{CM2}$ comprising the second offset compensation voltage is analogous), the first and second output voltages $VO^+$, $VO^-$ at the first and second output nodes $O^+$ and $O^-$ may be fed to the feedback circuit FB, and the first common mode voltage $V_{CM1}$ may result at the first common mode node CM1, where the first CM voltage $V_{CM1}$ comprises a first compensation voltage indicative of the offset present at the first and second output nodes $O^+$, $O^-$. The same may also apply to the second common mode voltage $V_{CM2}$, comprising a second compensation voltage indicative of the offset present at the first and second output nodes $O^+$, $O^-$, which may be similarly generated in the feedback circuit FB as a function of the first and second output voltages $VO^+$, $VO^-$.

Accordingly, at the first intermediate node X, a current Ifb from the drain of the third MOSFET M3 and a current IM1 from the drain of the first MOSFET M1 may sum (with sign), and the DC offset may be reduced, insofar as a (almost) null voltage Vx may be present at the first intermediate node X, resulting from a sum (with sign) between the negative DC voltage VM1 at the drain of the first MOSFET M1 and a positive replica Vfb of the first CM voltage $V_{CM1}$. In other words, at the first intermediate node X, the first input voltage $VI^+$ and the first CM voltage $V_{CM1}$ comprising the first offset compensation voltage may be amplified and the first output voltage $VO^+$ may be generated as a function of a difference between the amplified first input voltage $VI^+$ and first offset compensation voltage, that is a sum between the signals with the first offset compensation voltage having a sign opposite with respect to a sign of the amplified first input voltage VI⁺. Specifically:

$$Vx = VM1 + Vfb = IM1 * rx + Ifb * rx;$$

$$rx = rd3 \| rd1;$$

$$IM1 = -gm1 * VI^+;$$

$$Ifb = \frac{gm7 * gm3}{gm8} VO^+$$

$$VO^+ = -gm2 * (rd2 \| rd0) * Vx$$

where rx, rd3, rd1 and rd0 represent an overall resistance at the first intermediate node X, a resistance at the drain of the third MOSFET M3, a resistance at the drain of the first MOSFET M1 and an output resistance at the first output node O⁺, respectively, and $gm_i$ represent a transconductance of the respective MOSFET M1. The first output voltage VO⁺ may thus be written as:

$$VO^+ = -gm2 * (rd2 \| rd0) * \left(-gm1 * VI^+ * (rd3 \| rd1) + + \frac{gm7 * gm3}{gm8} VO^+ * (rd3 \| rd1)\right).$$

An overall DC gain G⁺ may be written as:

$$G^+ = \frac{VO^+}{VI^+} = \frac{gm2 * gm1 * (rd2 \| rd0) * (rd3 \| rd1)}{1 + \frac{gm2 * gm7 * gm3}{gm8} * (rd2 \| rd0) * (rd3 \| rd1)}$$

In particular, considering the gain G0⁺ of the first branch, that is a gain of the amplifier when no DC offset feedback is present, the DC gain G⁺ may comprise:

$$G^+ = G0^+ \frac{1}{1 + \frac{gm2 * gm7 * gm3}{gm8} * (rd2 \| rd0) * (rd3 \| rd1)} = G0^+ * K;$$

where a factor K may comprise a value smaller than the unitary value insofar as the transconductances $gm_i$ and the resistances $rd_i$ have positive values. Accordingly, the overall differential DC gain G⁺ may correspond to the gain G0+ of the differential amplifier when no DC offset compensation is present reduced by the factor K when a DC offset compensation is present, according to one or more embodiments. For example, if $gm_i$=1 mS and $rd_i$=10 kΩ, K may be about 0.04, which may result in an attenuation of the DC offset of about 28 dB with respect to a non-compensated amplifier such as the differential amplifier 10' of FIG. 1.

Providing a passive electrical component, such as a capacitor, may result in one or more advantages. For example:

the differential amplifier may have split behaviour when a DC offset is applied (e.g., the capacitor behaves as an open circuit) and when an AC input signal is applied (e.g., the capacitor behaves as a short circuit), the DC offset may be reduced while maintaining the differential gain for the AC signals, and normal operation of the feedback circuit FB may be maintained parallel to the DC offset feedback, with an acceptable value for common mode rejection ratio (CMRR).

In one or more embodiments, the presence of a DC offset feedback may lead to a reduced differential gain for signals having low frequencies. However, the possibility exists of employing a capacitor having a high capacitance value, e.g., equal to or higher than about 10 µF, that may result in a differential gain being reduced only at very low frequencies.

Figures 13, 14:
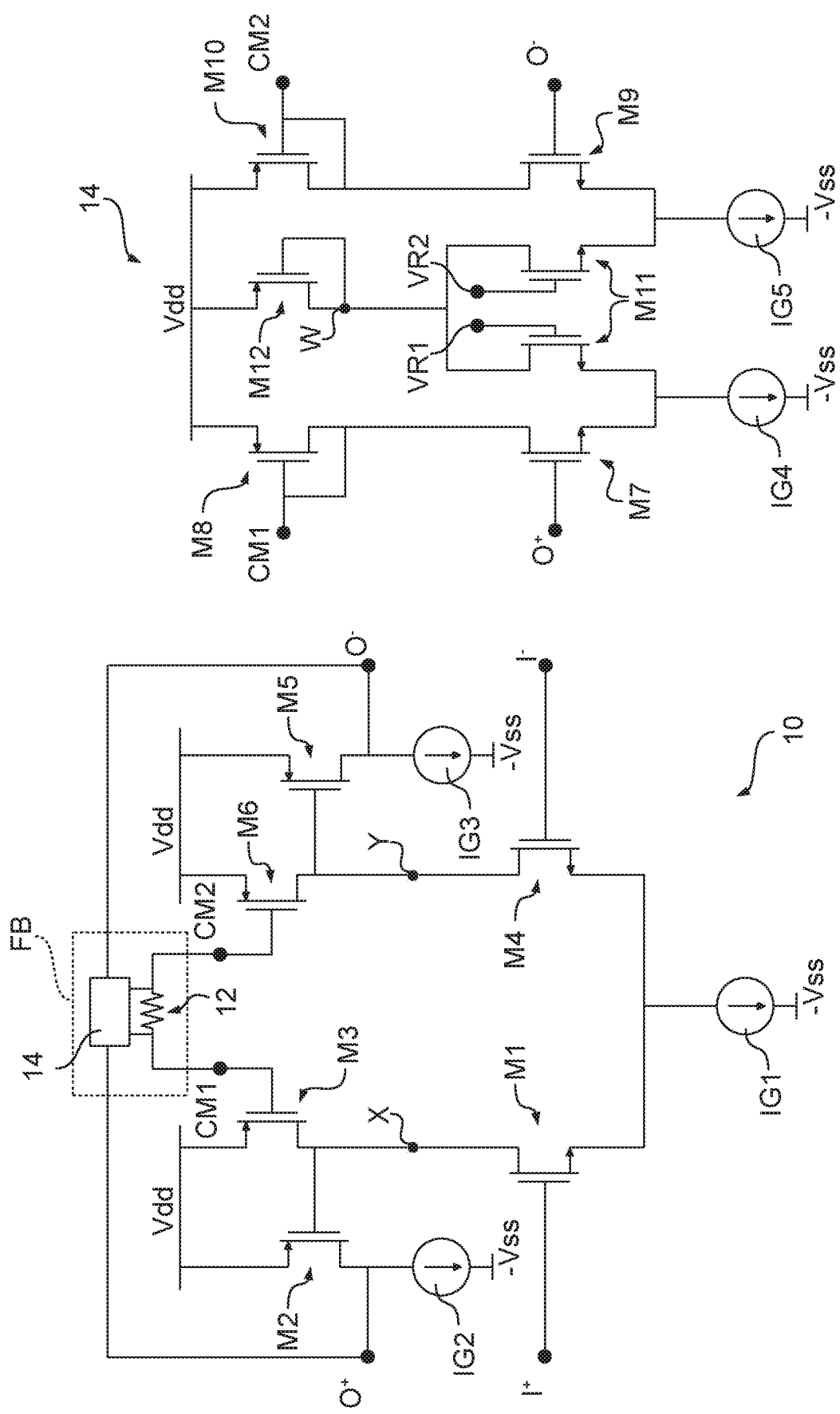

In one or more embodiments, as represented in FIG. 13, the (e.g., integrated) passive coupling circuit 12 may comprise a resistor. If the resistance is employed, a mid-point between a short circuit and an open circuit may result between the first and second common mode nodes CM1 and CM2. Accordingly, a trade-off between compensating a DC offset and retaining the differential gain is implemented.

In the embodiment considered, the DC offset may thus be reduced. In particular, increasing a resistance value of the resistor may result in decreasing the remaining DC offset as well as decreasing a differential gain (AC and DC) of the amplifier 10. An advantage of such a passive coupling circuit 12 including the resistor may comprise having a constant differential gain over a large range of frequencies, e.g., from DC up to high-frequencies of the amplifier band, as described in the following with reference to FIG. 15.

Such a solution may be advantageous for a number of different applications, and a small resistance value, e.g., of about 50Ω, may satisfy a trade-off between gain and offset reduction.

In one or more embodiments, if a small resistance value is chosen for the resistor of the passive coupling circuit, the feedback circuit FB may be implemented as exemplified in FIG. 14, where the reference voltage $V_{REF}$ provided at the gates of the transistors M1 may be decoupled and a first and a second reference voltages VR1 and VR2 may be supplied. Accordingly, performing an offset calibration may be feasible acting, e.g., on the reference voltages VR1 and VR2 and/or on the fourth and fifth current sources IG4, IG5 connected at the sources of the transistors M7, M9 and M11. An unbalance the reference voltages and/or the current sources IG4, IG5 may facilitate forcing a complementary offset with respect to the offset at the output nodes O⁺, O⁻. Such an offset compensation mechanism may be used when employing the passive coupling circuit 12 comprising the resistor, insofar as a small resistance value facilitates increasing the amplifier gain while also maintaining a non-negligible residual offset. The residual DC offset may be mitigated via the exemplified offset calibration mechanism. However, a relatively high unbalance of the reference voltages VR1 and VR2 and the bias currents in the feedback circuit 14 may cause a reduction in dynamic range, and the exemplified calibration technique may be acceptable only for a limited range of offset correction, e.g., about +/−200 mV.

Figure 15:
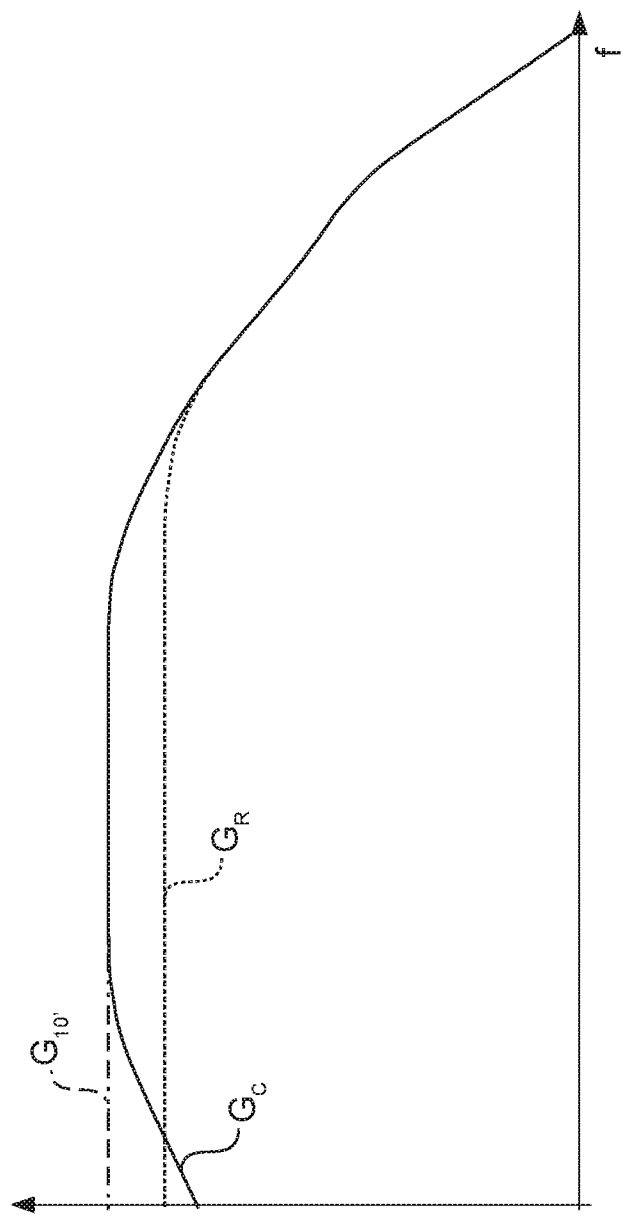

FIG. 15 represents a non-limiting example of a differential gain frequency response of various differential amplifiers, e.g., a gain $G_{10'}$ of the differential amplifier 10' of FIG. 1, not exhibiting an offset compensation, a gain $G_C$ of the differential amplifier 10 comprising a passive coupling circuit 12 having a capacitor (e.g., having value of about 10 µF), and a gain $G_R$ of the differential amplifier 10 comprising a passive coupling circuit 12 having a resistor. As discussed, the differential gain $G_C$ of the differential amplifier 10 comprising the capacitor, at low frequencies, is lower than the differential gain $G_{10'}$ of the differential amplifier 10'. However, the differential gain $G_C$ may increase and, at relatively medium-high operating frequencies, the differential gains $G_C$ and $G_{10'}$ may coincide.

Conversely, in case the differential amplifier having a resistor is employed, the differential gain $G_R$ may remain constant for low-medium frequencies, having a value lower than the discussed differential amplifiers 10' and 10. Only at very low frequencies, the gain $G_C$ of the differential amplifier 10 with the capacitor may be smaller than the differential gain GR of the differential amplifier 10 with the resistor.

Figure 16:
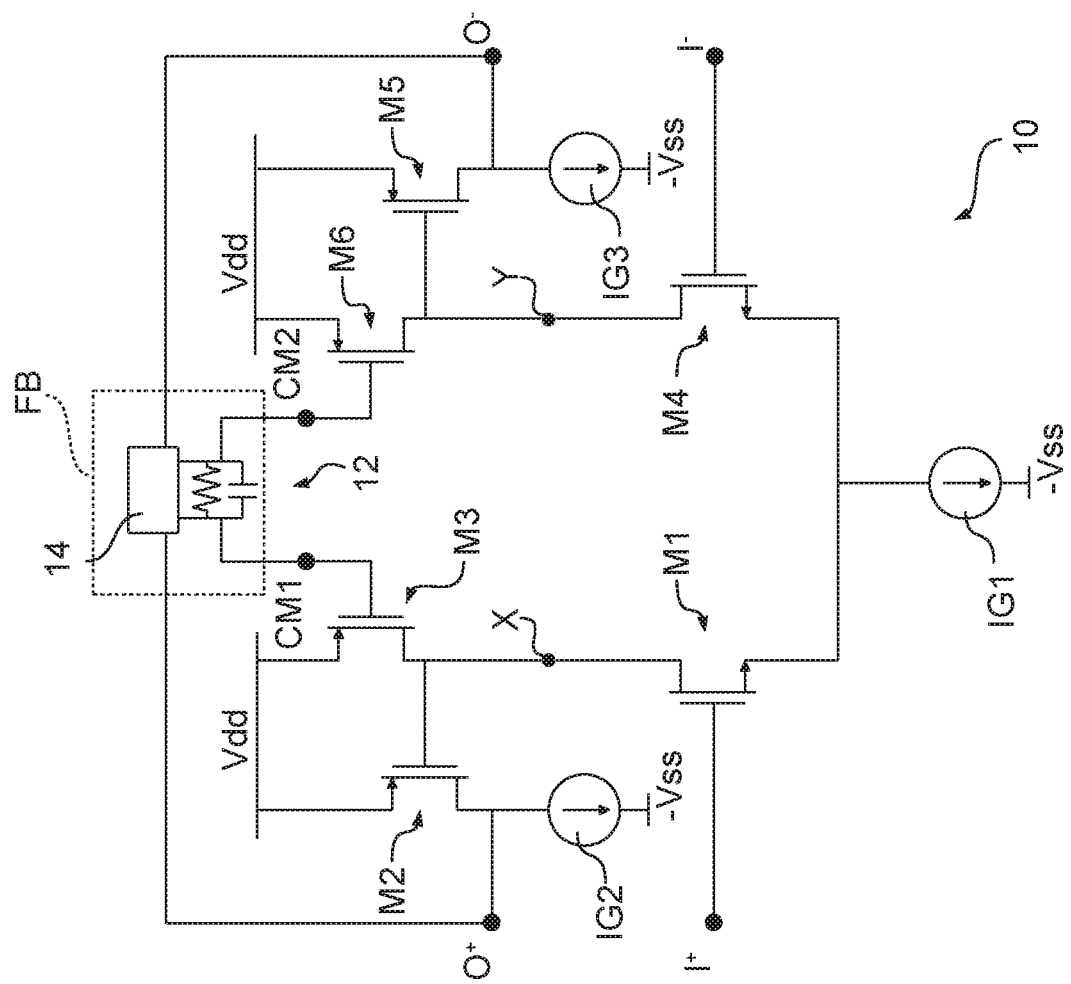

In various embodiments, as shown in FIG. 16, the possibility exists of comprising a passive coupling circuit 12 comprising a capacitor (e.g., of about 10 µF) and a resistor, arranged in parallel.

Figure 17:
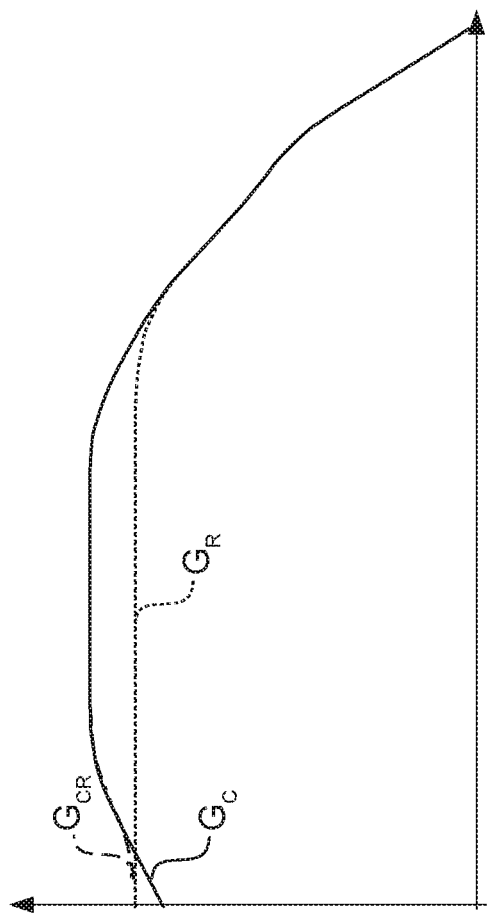
FIGS. 17 and 18 represent non-limiting examples of gain behaviors over frequency of differential amplifiers according to one or more embodiments.

With reference to FIG. 17, if the capacitance is arranged in parallel with the resistance, the differential gain GCR of the differential amplifier 10 may be improved, so that:

for AC signals, when the capacitor behaves as short circuit, the gain GCR may coincide with the gain $G_C$ of the differential amplifier 10 including solely the capacitor (i.e., the gain $G_{10'}$ of the differential amplifier 10'), and for DC (offset) components and low-frequency signals, the gain GCR may coincide with the gain GR of the differential amplifier 10 including the resistor.

Figure 18:
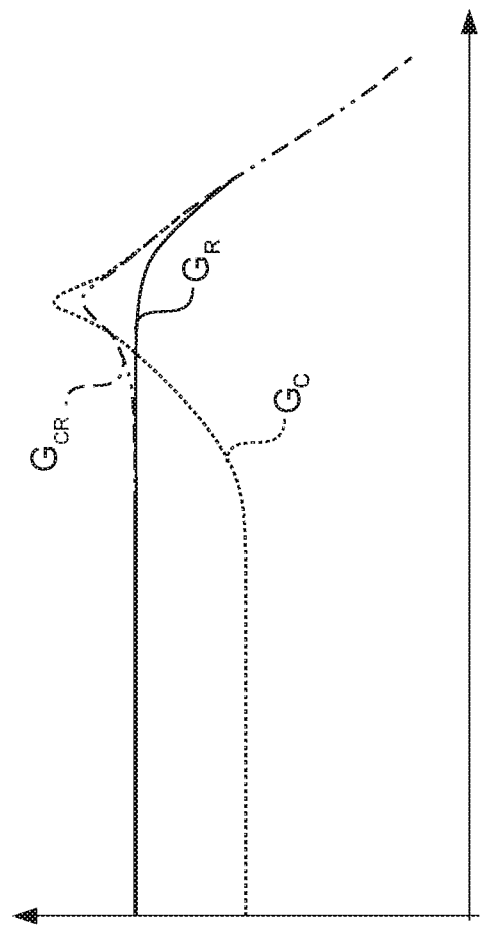

Also for example, FIG. 18 represents a gain frequency response of the differential amplifier 10 when a capacitor having value 300 pF is employed.

One or more embodiments may thus exhibit one or more of the following advantages:

an internal DC Offset compensation mechanism is possible, which may allow an open loop use of the differential amplifier, no degradation of input impedance occurs, in case a capacitor is employed, the differential gain may be high for AC signals, while also reducing the DC offset, in case a resistor is employed, a flat constant gain from DC frequencies to a higher corner band frequency of the differential amplifier may be obtained while also reducing the DC offset, a calibration of the offset may be feasible, e.g., if the resistance is employed, offset compensation may be continuous in time and may avoid reducing a maximum allowed frequency of the amplifier, already present circuits (e.g., a common mode feedback CMF circuit) may be used for implementing the solution, the offset compensation may adapt, e.g., DC offset compensation may take into account temperature or time drifts, a wideband solution may be possible, no charge injection may occur due to, e.g., switches changing state, low complexity and cost may be needed for realizing a differential amplifier according to one or more embodiments.

In one or more embodiments, the differential amplifier 10 may be comprised in an integrated circuit that may comprise a first and second signal output pad, a first and second signal input pad and a positive and negative power supply pads. In particular, in one or more embodiments, the passive coupling circuit may be internal with respect to the differential amplifier 10.

Conversely, the possibility exists of providing also first and second coupling pads, which may be connected to an external passive coupling circuit, e.g., a capacitor and/or a resistor.

Accordingly, the differential amplifier may adapt to the intended use, e.g., in case a constant gain may be desired a resistor may be connected to the coupling pads, whereas when a good trade-off between the DC offset compensation and AC gain may be desirable, a capacitor may be connected to the coupling pads, etc.

The differential amplifier 10 may be employed in different applications when an embedded offset reduction may be useful, e.g., in case the amplifier is used in a DC open loop configuration, such as in sensors, comparators and integrators.

Figure 19:
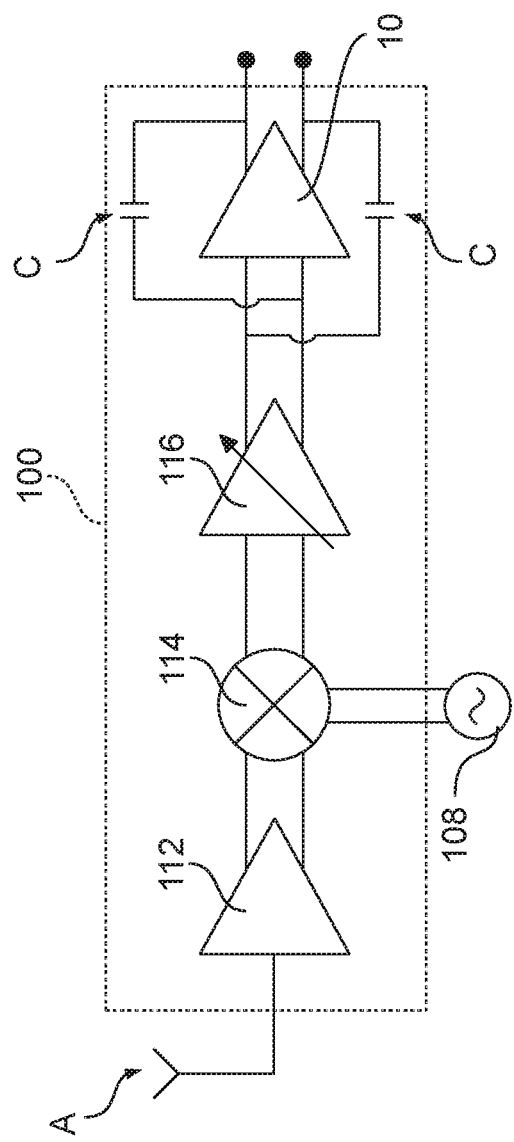
FIGS. 19 to 22 represent non-limiting examples of system employing a differential amplifier according to one or more embodiments.
Figure 20:
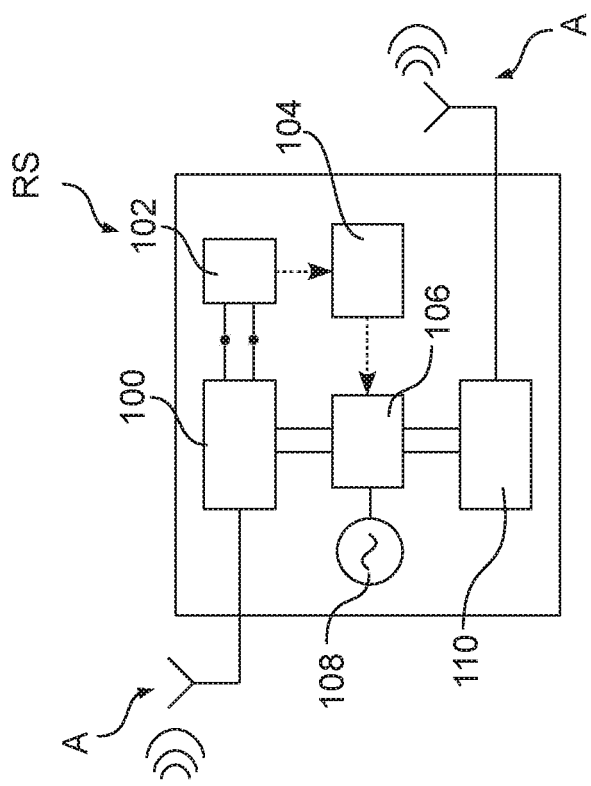

For example, as integrator, the differential amplifier 10 may be used for correlation function in a receiver section 100 of a radar system RS, as represented in FIGS. 19 and 20.

Generally, the radar system RS represented in FIG. 20 may comprise:

one or more transmission and reception antennas A, a receiver section 100, an analog-to-digital converter (ADC) 102, a microcontroller 104, a modulator/coder 106, a carrier signal source 108, sourcing a reference signal for the reception and transmission signals, and a transmitter section 110.

For example, the receiver section 100 may comprise:

a low noise amplifier (LNA) 112, receiving a reception signal from an antenna, a frequency mixer 114, mixing the received signal with a carrier signal sourced in the carrier signal source 108, a varying gain amplifier (VGA) 116, amplifying the mixed signal, and the differential amplifier 10, as an integrator, that is with the first and second output node connected, via capacitors C, to the second and first input node, respectively.

Figure 21:
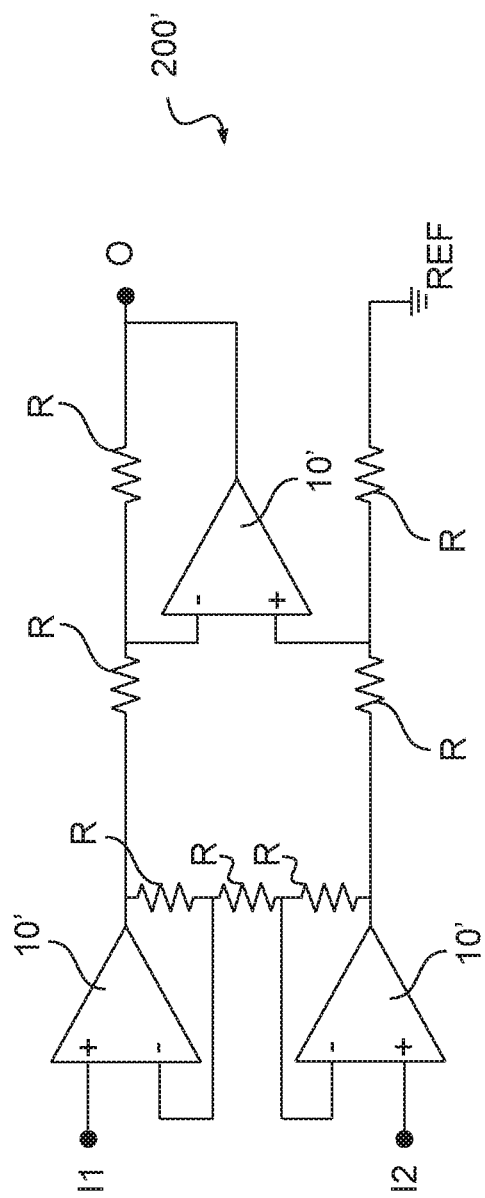
Figure 22:
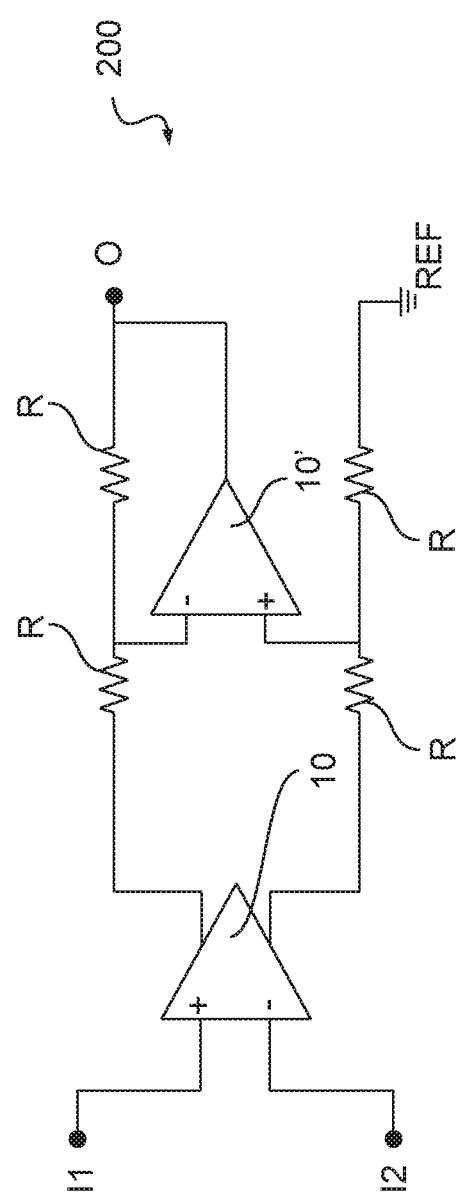

Also, the differential amplifier 100 according to one or more embodiments may be employed as an instrumentation amplifier (IA) 200, as shown in FIG. 22. Known amplifiers, such as an instrumentational amplifier 200' shown in FIG. 21, may comprise an input stage and an output stage.

The input stage conventionally comprises two different operational amplifiers that buffer the input voltage. A differential signal may be amplified while common-mode components of the signals may show a unity gain. In the output stage, the operational amplifiers perform a differential-to-single conversion, where the common-mode voltage is rejected insofar as the differential amplifiers configuration may act as a subtractor, while the differential signal may show a unity gain (or may be further amplified).

However, the DC Offset, being a differential signal, may affect the IA, and high differential gains may be impractical. The DC offset may have two components, relative to the input and the output section. As the gain is increased, the offset of the input stage may become dominant source of offset error. Accordingly, the offset may be compensated using one of the techniques already discussed.

The input stage may comprise:

a differential input, having two input terminals I1, 12 balanced and with high impedances, the input terminals I1, 12 providing a first input voltage and a second input voltage, a plurality of resistors R, and a first and a second differential amplifier 10', generating a first differential output voltage and a second differential output voltage, respectively.

In particular, the first amplifier 10' may receive, at a non-inverting input, the first input voltage and, at an inverting input, a signal indicative of a sum between the first differential output voltage and the second differential output voltage. Also, the second amplifier 10' may receive, at a non-inverting input, the second input voltage and, at an inverting input, a further signal indicative of the sum between the first differential output voltage and the second differential output voltage. Accordingly, using two differential amplifiers 10', the possibility exists of affecting a DC offset that may be present at the outputs of the first and second differential amplifiers 10'.

Also, the output stage of the instrumentation amplifier 200' may comprise:
- a single-ended output (O) with very low impedance,
- a reference node REF, connected to ground,
- an operational amplifier such as 10' in FIG. 1, and
- a plurality of resistors R.

In one or more embodiments, the differential amplifier 10 may be used in an instrumentation amplifier 200 exemplified in FIG. 22, where the output stage may substantially correspond to the conventional output stage of the instrumentation amplifier 200', and the input stage may comprise (e.g., consist) of the differential amplifier 10. For example, the differential amplifier 10 may receive, at a non-inverting input, the first input voltage and, at an inverting input, the second input voltage. Also, the differential amplifier 10 may be configured to amplify a difference between the first input voltage and the second input voltage, applied at input terminals and to reject common mode signal (high CMRR common mode rejection ratio).

In standard operational amplifiers, input and output impedance features may be affected, as well as the common mode rejection ration CMRR insofar as an external (e.g., to the amplifier 10') feedback with external components may be required.

Conversely, as exemplified in FIG. 22, the amplifier 10 used in the IA 200 may be used directly in open loop, with no further external components. This way, the input stage of an instrumentation amplifier 200 may be modified. The IA 200 may have one or more advantages, e.g., the IA 200 may be able to extract a small differential analog signal from transducers and other very small signal sources. Also, the possibility exists of reducing the number of components employed in the circuit, and of performing an improved offset reduction with respect to conventional instrumental amplifiers.

Conversely, in an instrumentation amplifier 200 comprising the differential amplifier 10 according to one or more embodiments, the standard two operational amplifiers may be replaced, and the feature of the IA 200 may be maintained with a further embedded offset compensation, e.g., in case of an output stage with unity differential gain.

For example, the differential amplifier 10 including the capacitor may be employed when the IA 200 may detect and amplify an AC differential signal.

For example, also the differential amplifier 10 including the resistor may be considered, that may be employed if the DC differential signal is to be amplified. For example, an external—or internal programmable—resistor may be adopted to obtain an adjustable gain.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A differential amplifier comprising:
   first and second input nodes configured to receive first and second input voltages, respectively;
   first and second output nodes configured to receive first and second output voltages, respectively;
   first and second supply nodes configured to receive first and second power supply voltages, respectively;
   first and second offset compensation nodes configured to receive first and second offset compensation voltages, respectively;
   a first amplifier stage configured to generate the first output voltage as a function of the first input voltage and the first offset compensation voltage;
   a second amplifier stage configured to generate the second output voltage as a function of the second input voltage and the second offset compensation voltage; and
   a feedback circuit configured to generate the first offset compensation voltage and the second offset compensation voltage as a function of the first and the second output voltages, wherein the feedback circuit comprises:
      a coupling circuit coupled between the first and second offset compensation nodes, or
      first and second terminals coupled to the first and second offset compensation nodes, respectively, wherein the first and second terminals are configured to be coupled to a coupling circuit external to the differential amplifier, wherein the coupling circuit comprises one or more passive electric components, wherein the coupling circuit comprises a resistor coupled between the first and second offset compensation node, and a capacitor in parallel with the resistor, the resistor and the capacitor coupled between the first and second offset compensation nodes.

2. The differential amplifier of claim 1, wherein:
   the first amplifier stage is configured to amplify the first input voltage, amplify the first offset compensation voltage, and generate the first output voltage as a function of a difference between the amplified first input voltage and the amplified first offset compensation voltage; and
   the second amplifier stage is configured to amplify the second input voltage, amplify the second offset compensation voltage, and generate the second output voltage as a function of a difference between the amplified second input voltage and the amplified second offset compensation voltage.

3. The differential amplifier of claim 1, further comprising a bias current source coupled to the second supply node, wherein:
   the first amplifier stage comprises a first transistor and a second transistor, the first transistor having a control terminal coupled to the first input node, a first current path terminal coupled to the bias current source, and a second current path terminal coupled to a first intermediate node, and the second transistor having a control terminal coupled to the first offset compensation node, a first current path terminal coupled to the first intermediate node, and a second current path terminal coupled to the first supply node, wherein the first output voltage is determined as a function of a voltage at the first intermediate node; and
   the second amplifier stage comprises a third transistor and a fourth transistor, the third transistor having a control terminal coupled to the second input node, a first current path terminal coupled to the bias current source, and a second current path terminal coupled to a second intermediate node, the fourth transistor having a control terminal coupled to the second offset compensation node, a first current path terminal coupled to the second intermediate node, and a second current path terminal coupled to the first supply node.

4. The differential amplifier of claim 3, further comprising:
   a fifth transistor coupled between the first output node and the first intermediate node; and a sixth transistor coupled between the second output node and the second intermediate node.

5. The differential amplifier of claim 1, wherein the first power supply voltage is higher than the second power supply voltage and wherein the second power supply voltage is about 0 V.

6. The differential amplifier of claim 1, wherein the capacitor is directly connected between the first and second offset compensation nodes.

7. The differential amplifier of claim 1, wherein the first offset compensation voltage comprises an AC component and a DC component, and the second offset compensation voltage comprises an AC component and a DC component, and wherein the feedback circuit is configured to:
generate the AC component of the first offset compensation voltage and the AC component of the second offset compensation voltage as a common mode component—as a function of the first and second output voltages;
generate the DC component of the first offset compensation voltage as a function of a DC component of the first output voltage; and
generate the DC component of the second offset compensation voltage as a function of a DC component of the second output voltage, wherein the DC component of the second offset compensation voltage is independent from the DC component of the first offset compensation voltage, wherein the DC component of the first offset compensation voltage and the DC component of the second offset compensation voltage represent a differential component.

8. A differential amplifier comprising:
first and second input nodes configured to receive first and second input voltages, respectively;
first and second output nodes configured to receive first and second output voltages, respectively;
first and second supply nodes configured to receive first and second power supply voltages, respectively;
first and second offset compensation nodes configured to receive first and second offset compensation voltages, respectively;
a first amplifier stage configured to generate the first output voltage as a function of the first input voltage and the first offset compensation voltage;
a second amplifier stage configured to generate the second output voltage as a function of the second input voltage and the second offset compensation voltage; and
a feedback circuit configured to generate the first offset compensation voltage and the second offset compensation voltage as a function of the first and the second output voltages, wherein the feedback circuit comprises:
a coupling circuit coupled between the first and second offset compensation nodes, or
first and second terminals coupled to the first and second offset compensation nodes, respectively, wherein the first and second terminals are configured to be coupled to a coupling circuit external to the differential amplifier, wherein the coupling circuit comprises one or more passive electric components, wherein the feedback circuit comprises:
a first bias current source;
a second bias current source;
a fifth transistor having a current path coupled between the first bias current source and a first node, and a control terminal coupled to the first output node;
a sixth transistor having a current path coupled between the first node and the first supply node, and a control terminal coupled to the first offset compensation node;
a seventh transistor having a current path coupled between the second bias current source and a second node, and a control terminal coupled to the second output node; and
an eighth transistor having a current path coupled between the second node and the first supply node, and a control terminal coupled to the second offset compensation node.

9. The differential amplifier of claim 8, wherein the feedback circuit comprises an offset calibration circuit configured to generate the first and second offset compensation voltages as a function of the first and second output voltages, a first and second reference voltages or the first and second bias current sources.

10. An integrated circuit comprising a differential amplifier that comprises:
first and second input nodes configured to receive first and second input voltages, respectively;
first and second output nodes configured to receive first and second output voltages, respectively;
first and second supply nodes configured to receive first and second power supply voltages, respectively;
first and second offset compensation nodes configured to receive first and second offset compensation voltages, respectively;
a first amplifier stage configured to generate the first output voltage as a function of the first input voltage and the first offset compensation voltage;
a second amplifier stage configured to generate the second output voltage as a function of the second input voltage and the second offset compensation voltage; and
a feedback circuit configured to generate the first offset compensation voltage and the second offset compensation voltage as a function of the first and the second output voltages, wherein the feedback circuit comprises:
first and second coupling nodes configured to be coupled to each other via a resistor in parallel with a capacitor, the first and second coupling node coupled to the first and second offset compensation nodes, respectively.

11. The integrated circuit of claim 10, further comprising a varying gain amplifier having first and second outputs coupled to the first and second input nodes of the differential amplifier, respectively.

12. The integrated circuit of claim 10, further comprising a second differential amplifier having first and second inputs coupled to the first and second output nodes of the differential amplifier, respectively, and wherein the differential amplifier and the second differential amplifier form an instrumentation amplifier.

13. The integrated circuit of claim 10, further comprising a reception module of a radar system that comprises the differential amplifier.

14. A method of reducing a DC offset in a differential amplifier, the method comprising:
receiving first and second input voltages with first and second input nodes of the differential amplifier, respectively;
receiving a first and second supply voltages with first and second power supply nodes of the differential amplifier, respectively;
receiving first and second offset compensation voltages with first and second offset compensation nodes of the differential amplifier, respectively, wherein the first and second offset compensation nodes are directly connected to each other via a capacitor;

generating first and second output voltages at first and second output nodes of the differential amplifier, respectively, with first and second amplifier stages, respectively, wherein generating the first and second output voltages comprises generating the first and second output voltages based on the first and second input voltages and the first and second offset compensation nodes; and generating the first and second offset compensation voltages based on the first and second output voltages, wherein a first transistor has a current path coupled between the first power supply node and the first output node, and a control terminal directly connected to the first offset compensation node, and wherein a second transistor has a current path coupled between the first power supply node and the second output node, and a control terminal directly connected to the second offset compensation node.

15. The method of claim 14, wherein a resistor is coupled in parallel with the capacitor.

16. A differential amplifier comprising:
first and second input nodes configured to receive first and second input voltages, respectively;
first and second output nodes configured to receive first and second output voltages, respectively;
first and second supply nodes configured to receive first and second power supply voltages, respectively;
a bias current source coupled to the second supply node;
a first transistor having a control terminal coupled to the first input node, a first current path terminal coupled to the bias current source, and a second current path terminal coupled to a first intermediate node that is coupled to the first output node;
a second transistor having a first current path terminal coupled to the first intermediate node, and a second current path terminal coupled to the first supply node;
a third transistor having a control terminal coupled to the second input node, a first current path terminal coupled to the bias current source, and a second current path terminal coupled to a second intermediate node that is coupled to the second output node;
a fourth transistor having a first current path terminal coupled to the second intermediate node, and a second current path terminal coupled to the first supply node;
a resistor directly connected between a control terminal of the second transistor and a control terminal of the fourth transistor; and
a feedback circuit having a first input coupled to the first output node, a second input coupled to the second output node, a first output coupled to a third intermediate node between the control terminal of the second transistor and the resistor, and a second output coupled to a fourth intermediate node between the control terminal of the fourth transistor and the resistor.

17. The differential amplifier of claim 16, further comprising a capacitor coupled in parallel with the resistor.

18. The differential amplifier of claim 16, wherein the feedback circuit comprises:
a fifth transistor having a control terminal coupled to the first input of the feedback circuit;
a sixth transistor having a current path coupled between a current path of the fifth transistor and the first supply node, and a control terminal coupled to the first output of the feedback circuit;
a seventh transistor having a control terminal coupled to the second input of the feedback circuit; and
an eighth transistor having a current path coupled between a current path of the seventh transistor and the first supply node, and a control terminal coupled to the second output of the feedback circuit.

19. The differential amplifier of claim 18, wherein the feedback circuit further comprises:
a ninth transistor;
a tenth transistor having a current path coupled between a current path of the ninth transistor and the current path of the fifth transistor; and
an eleventh transistor having a current path coupled between the current path of the ninth transistor and the current path of the eighth transistor.

20. The differential amplifier of claim 19, wherein a control terminal of the tenth transistor is coupled to a control terminal of the eleventh transistor.

* * * * *